(12) United States Patent
Cho (10) Patent No.: US 12,154,984 B2
(45) Date of Patent: Nov. 26, 2024

(54) SEMICONDUCTOR DEVICE AND METHOD FOR MANUFACTURING SAME

(71) Applicant: DB HiTek Co., Ltd., Bucheon-si (KR)

(72) Inventor: Jun Hee Cho, Cheongju-si (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 379 days.

(21) Appl. No.: 17/720,148

(22) Filed: Apr. 13, 2022

(65) Prior Publication Data

US 2022/0336658 A1 Oct. 20, 2022

(30) Foreign Application Priority Data

Apr. 16, 2021 (KR) .................. 10-2021-0049524

(51) Int. Cl.
| | | |
|---|---|---|
| *H01L 29/78* | (2006.01) | |
| *H01L 21/8234* | (2006.01) | |
| *H01L 29/06* | (2006.01) | |
| *H01L 29/10* | (2006.01) | |
| *H01L 29/40* | (2006.01) | |
| *H01L 29/66* | (2006.01) | |

(52) U.S. Cl.
CPC .. *H01L 29/7816* (2013.01); *H01L 21/823456* (2013.01); *H01L 29/0696* (2013.01); *H01L 29/1095* (2013.01); *H01L 29/402* (2013.01); *H01L 29/66681* (2013.01)

(58) Field of Classification Search
CPC ......... H01L 21/823456; H01L 29/0696; H01L 29/1095; H01L 29/0649; H01L 29/4991; H01L 29/66681–66704; H01L 29/7816–7826; H01L 29/515
See application file for complete search history.

(56) References Cited

U.S. PATENT DOCUMENTS

| | | | |
|---|---|---|---|
| 8,754,474 B2 | 6/2014 | Ko | |
| 9,871,132 B1* | 1/2018 | Liu | ............... H01L 29/7835 |
| 2012/0126322 A1 | 5/2012 | Ko | |
| 2017/0352731 A1* | 12/2017 | Kuo | ............... H01L 29/665 |
| 2018/0219093 A1* | 8/2018 | Chou | ............... H01L 23/49562 |
| 2022/0059665 A1* | 2/2022 | Mun | ............... H01L 29/41775 |

FOREIGN PATENT DOCUMENTS

KR 10-2012-0055139 A 5/2012

* cited by examiner

*Primary Examiner* — Shahed Ahmed
(74) *Attorney, Agent, or Firm* — Andrew D. Fortney; Central California IP Group, P.C.

(57) ABSTRACT

Disclosed is a semiconductor device and a method for manufacturing the same and, more particularly, a semiconductor device and a method for manufacturing the same seeking to improve on-resistance and breakdown voltage characteristics compared to existing semiconductor structures by forming an air gap under a gate field plate adjacent to a gate electrode or over a drift region of the semiconductor device.

5 Claims, 8 Drawing Sheets

SEMICONDUCTOR DEVICE AND METHOD FOR MANUFACTURING SAME

CROSS REFERENCE TO RELATED APPLICATION(S)

The present application claims priority to Korean Patent Application No. 10-2021-0049524, filed on Apr. 16, 2021, the entire contents of which are incorporated herein.

Technical Field

The present disclosure relates to a semiconductor device and a method for manufacturing the same and, more particularly, to a semiconductor device and a method for manufacturing the same seeking to improve on-resistance and breakdown voltage characteristics compared to existing semiconductor structures by forming an air gap under a metal field plate formed on the side adjacent to a gate electrode.

Background Art

A lateral double-diffused metal oxide semiconductor (LDMOS) transistor is a power device with fast switching response and high input impedance. Hereinafter, a structure and problems of a semiconductor device having a field plate and a shallow trench isolation (STI) region in the semiconductor substrate thereof will be described in detail.

Figure 1:
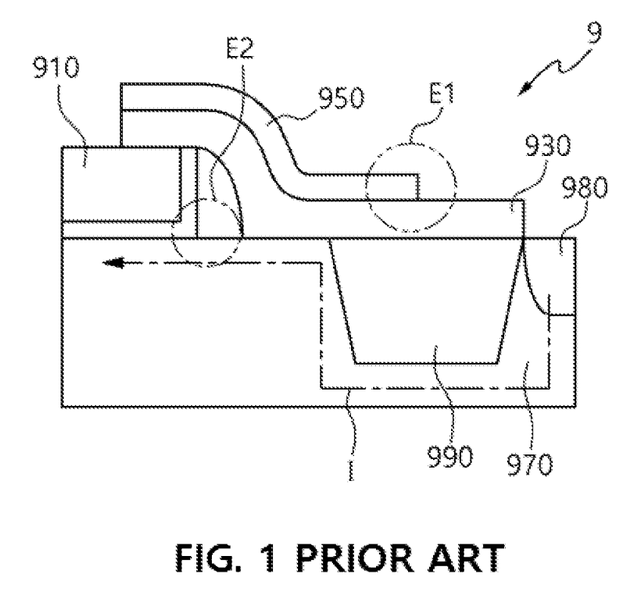
FIG. 1 is a cross-sectional view of part of a conventional LDMOS device.

FIG. 1 is a cross-sectional view of part of a conventional LDMOS device.

Referring to FIG. 1, in the conventional LDMOS device 9, an insulating pattern 930 is formed on a gate electrode 910, and a field plate 950 is formed on the insulating pattern 930. The insulating pattern 930 may be an oxide layer. In such a structure, the field plate 950 makes it possible to obtain a low on-resistance, but the breakdown voltage characteristic is may deteriorate.

To be specific, in the conventional structure, an electric field concentration occurs on the distal side E1 of the field plate 950 adjacent to a drain 980 and at the lowermost end corner E2 of the gate electrode 910 nearest to the drain 980. In order to suppress the resulting degradation of the breakdown voltage characteristic, the STI region 990, which may extend deeply downward, is formed below the E1 side of the field plate 950.

A depletion width in a drift region 970 may be induced when a voltage is applied to the drain 980. This depletion width increases near the surface of the drift region by the STI 990, and thus, the breakdown voltage characteristic may be improved. In addition, the STI structure 990 may increase a drift length within the drift region, thereby lowering the intensity of the peak electric field at the end of the channel region.

However, due to the STI structure 990, a current path length in the drift region 970 inevitably increases, causing a problem that the on-resistance characteristic of the device deteriorates.

That is, although the field plate 950 improves the on-resistance characteristic of the device, the on-resistance characteristic deteriorates because of the STI 990, which improves the breakdown voltage characteristic.

To solve such a problem, the present disclosure intends to present a high voltage semiconductor device having a novel structure and a method for manufacturing the same, the details of which are described herein.

Document of Related Art (

Patent Document 0001) Korean Patent Application Publication No. 10-2012-0055139 "LDMOS SEMICONDUCTOR DEVICE"

SUMMARY OF THE INVENTION

The present disclosure has been made to solve the problems of the related art, and an objective of the present disclosure is to provide a semiconductor device and a method for manufacturing the same that realizes an excellent breakdown voltage characteristic without the STI feature, in order to prevent deterioration of the on-resistance characteristic of the device due to the STI feature, which otherwise improves the breakdown voltage characteristic of the device in the presence of a gate field plate.

Moreover, an objective of the present disclosure is to provide a semiconductor device and a method for manufacturing the same that improves the breakdown voltage characteristic of the device without the STI feature by forming an air gap having a low dielectric constant between the drift region and an insulating pattern.

Furthermore, an objective of the present disclosure is to provide a semiconductor device and a method for manufacturing the same that facilitates manufacturing by forming a contact plug having an increased width on the insulating pattern to replace the gate field plate, without requiring an additional gate field plate formation process.

The present disclosure may be implemented by embodiments having one or more of the following configurations in order to achieve the above-described objectives.

According to one or more embodiments of the present disclosure, a semiconductor device of the present disclosure includes a semiconductor layer; a drift region in the semiconductor layer; a body region in the semiconductor layer; a drain in the drift region; a source in the body region; a gate structure on the semiconductor layer; an insulating pattern on the gate structure and the drift region; a gate field plate on the insulating pattern; and an air gap between the insulating pattern and the semiconductor layer.

According to one or more other embodiments of the present disclosure, the insulating pattern may extend onto the gate structure from the drift region, and the air gap may have one end or side adjacent to the drain that is open and another end or side that is covered by the insulating pattern.

According to yet one or more other embodiments of the present disclosure, the semiconductor device further includes a silicide film on the drain, the source, a gate electrode (e.g., of the gate structure) and the gate field plate.

According to yet one or more other embodiments of the present disclosure, the semiconductor device further includes contact plugs electrically connected to the drain, the source, the gate electrode (e.g., of the gate structure), and the gate field plate, respectively; and a body contact in contact with the source.

According to yet one or more other embodiments of the present disclosure, the air gap may be formed by a surface micromachining process.

According to yet one or more other embodiments of the present disclosure, a semiconductor device of the present disclosure includes a semiconductor layer; a drift region of a second conductivity type in the semiconductor layer; a body region of a first conductivity type in the semiconductor layer; a drain of the second conductivity type in the drift region; a source of the second conductivity type in the body region; a gate structure on the semiconductor layer; an insulating pattern on the gate structure and the drift region; an air gap between the insulating pattern and the semiconductor layer; and a conductive contact plug in contact with the insulating pattern and comprising a conductive material.

According to yet one or more other embodiments of the present disclosure, the semiconductor device further includes a drain contact plug electrically connected to the drain; a source contact plug electrically connected to the source; and a gate contact plug electrically connected to the gate structure, wherein the conductive contact plug may have a width greater than that of the drain contact plug, the source contact plug, and the gate contact plug.

According to yet one or more other embodiments of the present disclosure, the conductive contact plug may have one end that overlaps the gate structure and another end adjacent to an end of the insulating pattern on a side adjacent to the drain.

According to yet one or more other embodiments of the present disclosure, the drain may have a substantially planar uppermost surface.

According to yet one or more other embodiments of the present disclosure, the conductive contact plug may be formed simultaneously with the drain contact plug, the source contact plug, and the gate contact plug. Thus, the conductive contact plug, the drain contact plug, the source contact plug, and the gate contact plug may have identical compositions and substantially similar and/or identical physical properties.

According to one or more embodiments of the present disclosure, a method for manufacturing a semiconductor device includes forming a drift region in a semiconductor layer; forming a body region in the semiconductor layer; forming a gate structure on the semiconductor layer; forming a drain in the drift region; forming a source in the body region; forming an insulating pattern on the gate structure and the drift region; forming an air gap between the insulating pattern and the semiconductor layer; and forming a gate field plate on the insulating pattern.

According to one or more other embodiments of the present disclosure, forming the air gap may include depositing a sacrificial layer on the semiconductor layer, and forming the insulating pattern may include depositing an insulating material on the sacrificial layer; and etching the insulating material to form the insulating pattern.

According to yet one or more other embodiments of the present disclosure, forming the air gap may further include etching the sacrificial layer after forming the insulating pattern.

According to yet one or more other embodiments of the present disclosure, the sacrificial layer may comprise a material different from the insulating material.

According to yet one or more other embodiments of the present disclosure, when forming the air gap, the sacrificial layer may be etched so that an end or side of the air gap is covered by the insulating pattern.

According to yet one or more other embodiments of the present disclosure, a method for manufacturing a semiconductor device includes forming a drift region in a semiconductor layer; forming a body region in the semiconductor layer; forming a drain in the drift region; forming a source in the body region; forming a body contact in contact with the source; forming a gate structure on the semiconductor layer; forming an insulating pattern on the gate structure and the drift region; forming an air gap between the insulating pattern and the semiconductor layer; and forming a conductive contact plug on an upper surface of the insulating pattern.

According to yet one or more other embodiments of the present disclosure, the method for manufacturing a semiconductor device further includes forming a drain contact plug on the drain; forming a source contact plug on the source; and forming a gate contact plug on the gate structure, wherein the conductive contact plug, the drain contact plug, the source contact plug, and the gate contact plug may be formed in substantially simultaneously (e.g., in the same process).

According to yet one or more other embodiments of the present disclosure, the conductive contact plug may have one end that overlaps the gate structure and another end adjacent to an end of the insulating pattern on a side adjacent to the drain.

The present disclosure has the following effects by the above configurations.

The present disclosure can realize an excellent breakdown voltage characteristic without the STI feature in order to prevent deterioration of the on-resistance of the device due to the STI, which otherwise improves the breakdown voltage characteristic when forming a gate field plate.

In addition, the present disclosure can improve the breakdown voltage characteristic of the device without the STI feature by forming an air gap having a low dielectric constant between the drift region and the insulating pattern.

Furthermore, the present disclosure can facilitate manufacturing by forming a contact plug having an increased width on an insulating pattern to replace the gate field plate and avoid an additional gate field plate formation process.

Meanwhile, it should be added that even if effects are not explicitly mentioned herein, the effects described in the following specification expected by the technical features of the present disclosure and their potential effects are treated as if they were described in the specification of the present disclosure.

DESCRIPTION OF DRAWINGS

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the claims. In addition, these embodiments are only provided for reference in order to more completely explain the present disclosure to those of ordinary skill in the art.

As used herein, the singular form may include the plural form unless the context clearly dictates otherwise. Further, as used herein, "comprise" and/or "comprising" refers to the specific existence of the recited shapes, numbers, steps, actions, members, elements and/or groups, and does not exclude the presence or addition of one or more other shapes, numbers, actions, members, elements and/or groups.

In this specification, it should be noted that the individual components may be integral with other components or separate from other components as necessary or desired, and there is no separate limitation thereto.

Semiconductor devices 1 and 1' of the present disclosure may be, for example, LDMOS devices.

Figure 2:
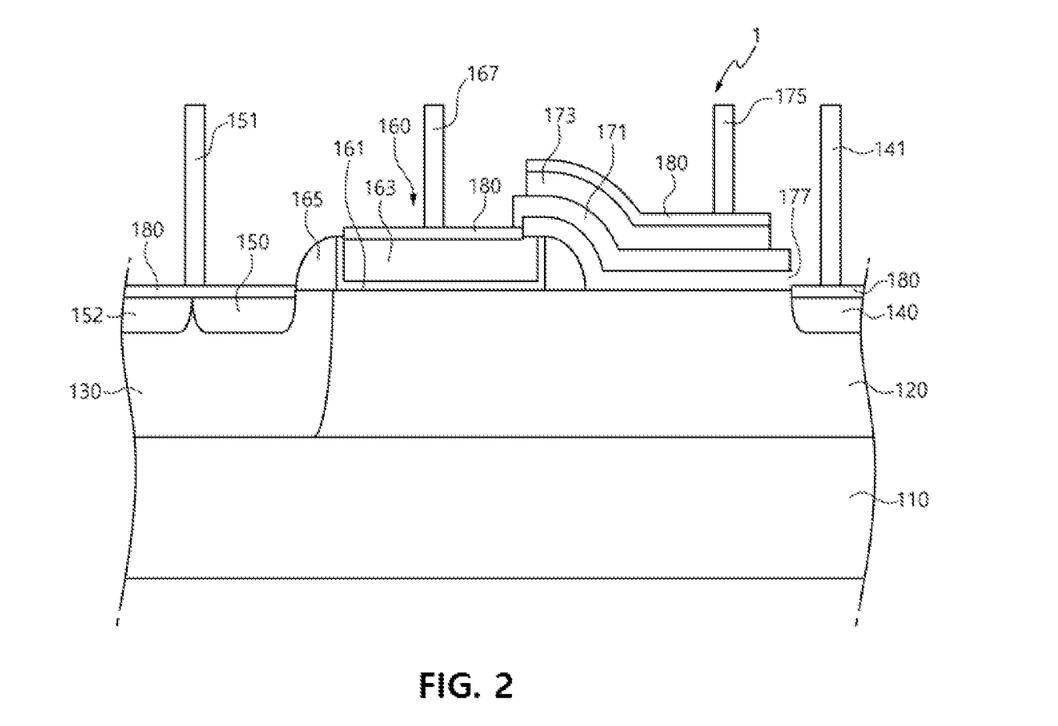
FIG. 2 is a cross-sectional view of a semiconductor device according to one or more embodiments of the present disclosure.

FIG. 2 is a cross-sectional view of a semiconductor device according to one or more embodiments of the present disclosure.

Hereinafter, a semiconductor device according to one or more embodiments of the present disclosure will be described in detail with reference to the accompanying drawings.

Referring to FIG. 2, the present disclosure relates to a semiconductor device 1 and a method for manufacturing the same and, more particularly, to a semiconductor device 1 and a method for manufacturing the same seeking to improve on-resistance and breakdown voltage characteristics compared to existing semiconductor structures by forming an air gap under a metal field plate and adjacent to a gate electrode.

First, the semiconductor device 1 may include a drift region 120 in a semiconductor layer 110 and a body region 130. The semiconductor layer 110 may be or comprise a semiconductor substrate having a first conductivity type (e.g., an n-type or a p-type), or a semiconductor on insulator (SOI) substrate. In the latter case, the semiconductor layer on the insulator has the first conductivity type. Alternatively, the semiconductor layer 110 may be or comprise an epitaxial layer of the first conductivity type, but is not limited thereto.

The drift region 120 may be an impurity region having a second conductivity type (e.g., the other of the n-type or the p-type, different from the first conductivity type) having a relatively low impurity concentration. The drift region 120 surrounds a drain 140. The drain 140 may be an impurity region of the second conductivity type having a relatively higher impurity concentration than that of the drift region 120. Additionally, the drain 140 may be electrically connected to a drain contact plug 141. The drain contact plug 141 extends to or from the drain 140 and may comprise a conductive material such as polysilicon, tungsten, aluminum, copper, or the like.

When the doping concentration in the drift region 120 is below a certain level, an on-resistance (Rsp) characteristic deteriorates. On the contrary, when the doping concentration is above a certain level, the on-resistance (Rsp) characteristic is improved, but the breakdown voltage (BV) deteriorates. Thus, it is desirable to form an impurity region having an appropriate doping concentration or level in consideration of these characteristics.

The body region 130 may be an impurity region of the first conductivity type. The body region 130 may surround a source 150 and a body contact 152. The source 150 may be a high-concentration impurity region of a second conductivity type, and may directly contact one side of the body contact 152.

The source 150 is electrically connected to a source contact plug 151, and the source contact plug 151 is extend to or from the source 150 and may comprise a conductive material such as polysilicon, tungsten, aluminum, copper, or the like. The body contact 152 may be or comprise a high-concentration impurity region of the first conductivity type. A channel region serving as a carrier (e.g., an electron) movement path may be formed between the drain 140 and the source 150 (e.g., upon application of a predetermined voltage).

A gate structure 160 may be on the semiconductor layer 110, for example, on or over the channel region. To explain in detail, a gate insulating layer 161 and a gate electrode 163 may be on the semiconductor layer 110. The gate insulating layer 161 comprises, for example, an oxide layer (e.g., silicon dioxide), and the gate electrode 163 may be or comprise, for example, a polysilicon layer, but is not limited thereto. A sidewall spacer 165 is on a side surface of the gate electrode 163 and may be or comprise, for example, an oxide film (e.g., silicon dioxide), a nitride film (e.g., silicon nitride), or a combination thereof. A gate contact plug 167 may be on the gate electrode 163, and may comprise a conductive material such as polysilicon, tungsten, aluminum, copper, or the like.

In addition, an insulating pattern 171 may be on or over the gate structure 160 and the drift region 120. For example, the insulating pattern 171 may extend onto the gate electrode 163 and over the drift region 120. The insulating pattern 171 may partially cover the upper surface of the gate electrode 163, and may or may not partially overlap a silicide film 180 on the gate electrode 163. The insulating pattern 171 may comprise a nitride layer (e.g., silicon nitride), and preferably comprises a material different from that of a sacrificial layer (to be described later), but the insulating pattern 171 is not limited to silicon nitride. The thickness of the insulating pattern 171 may correspond to, or be adjusted according to, a breakdown voltage for the device 1.

Agate field plate 173 whose lowermost surface has a shape complementary to the uppermost surface of the insulating pattern 171 may be on the insulating pattern 171. For example, the gate field plate 173 may partially overlap the gate structure 160 and the drift region 120. The gate field plate 173 may comprise, for example, a polysilicon layer, but is not limited thereto. In addition, the gate field plate 173 may be electrically connected to a plate contact plug 175. The plate contact plug 173 extends to or from the gate field plate 173 and may comprise a conductive material such as polysilicon, tungsten, aluminum, copper, or the like.

Hereinafter, with reference to the accompanying drawings, the structure of the conventional semiconductor device 9 and problems derived therefrom, and the structure of the present disclosure for solving these problems will be described in detail.

Referring to FIG. 1, in the conventional semiconductor device 9, an insulating pattern 930 is formed on a gate electrode 910, and a field plate 950 is formed on the insulating pattern 930. The insulating pattern 930 may be a silicon oxide layer. In such a structure, it is possible to obtain a low on-resistance using the field plate 950, but the breakdown voltage characteristic may deteriorate.

To be specific, in the conventional structure, an electric field concentration occurs on the distal side E1 of the field plate 950 adjacent to the drain 980 and at the lowermost corner E2 of the gate electrode 910 nearest to the drain 980. In order to suppress the resulting degradation of the breakdown voltage characteristic, the STI 990 region is formed in the drift region 970 of the substrate, below the distal side E1 of the field plate 950.

A depletion width in the drift region 970 induced as a result of a predetermined voltage applied to the drain 980 increases near the surface of the drift region the STI 990. Thus, the breakdown voltage characteristic may improve. In addition, the STI structure 990 may increase a drift length in the drift region, thereby lowering the intensity of the peak electric field at the end of the channel region.

However, due to the STI structure 990, the current path length in the drift region 970 inevitably increases, causing the on-resistance of the device to deteriorate. That is, although the field plate 950 improves the on-resistance of the device, the on-resistance deteriorates because of the STI 990 (which improves the breakdown voltage characteristic).

In order to avoid such a problem, referring to FIG. 2, the semiconductor device 1 according to one or more embodiments of the present disclosure includes an air gap 177 under the insulating pattern 171. For example, the air gap 177 may extend to the gate electrode 163 from the drift region 120. It is preferable that the air gap 177 has a shape corresponding to the insulating pattern 171, but has a length or width shorter than that of the insulating pattern 171. The dielectric constant of the insulating pattern 930, which is a silicon dioxide layer in the conventional structure 9, is about 3.9, whereas the dielectric constant of air or other gas inside the air gap is about 1.0. Accordingly, the air gap 177 structure may bring about a greater insulating effect and improve the breakdown voltage characteristic. Since the breakdown voltage characteristic is improved without the conventional STI feature 990, the problem of an increase in the current path length does not occur, and it is possible to prevent the on-resistance characteristic from deteriorating.

A silicide film 180 may be on the drain 140, the source 150, the gate electrode 163, and the gate field plate 173. The silicide film 180 may contact the contact plugs 141, 151, 167 and 175. The silicide film 180 corresponds to a layer formed annealing a metal layer such as cobalt (Co), nickel (Ni), or titanium (Ti) on the corresponding polysilicon structure to improve contact resistance and thermal stability.

Figure 3:
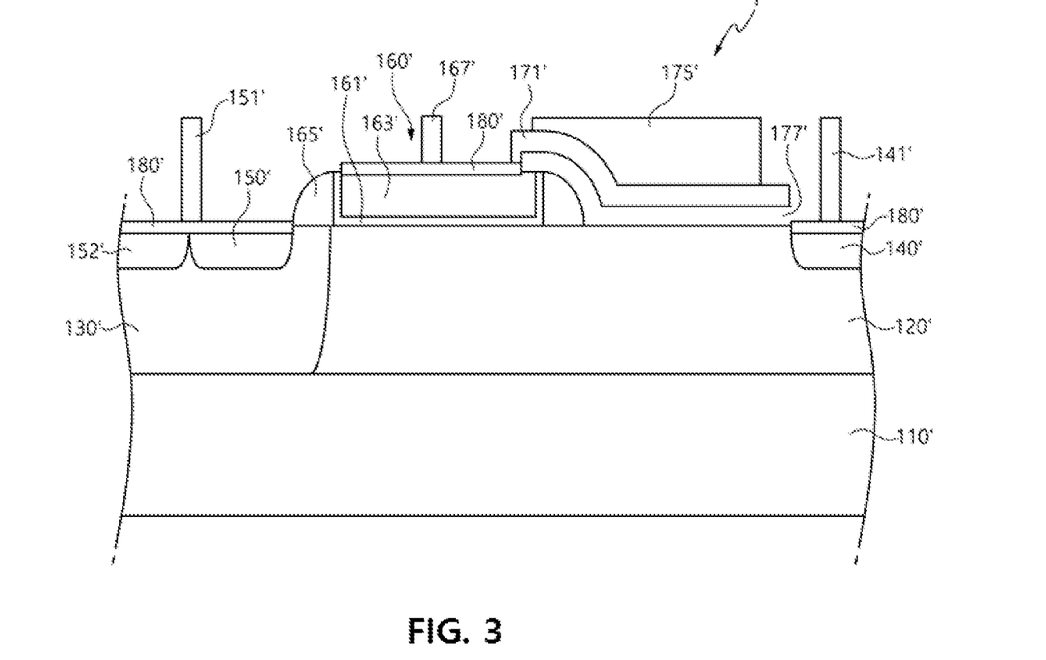
FIG. 3 is a cross-sectional view of a semiconductor device according to another embodiment of the present disclosure.

FIG. 3 is a cross-sectional view of a semiconductor device according to another embodiment of the present disclosure.

Hereinafter, the semiconductor device 1' according to the other embodiment of the present disclosure will be described in detail with reference to the accompanying drawings, and configurations overlapping those of the device 1 in FIG. 2 will be omitted for convenience of description.

The semiconductor device 1' does not include a separate gate field plate on the insulating pattern 171'. Instead, a contact plug 175' is on the insulating pattern 171'. The contact plug 175' has a width larger than that of the plug 175 in FIG. 2. For example, the contact plug 175' may have one side or end that overlaps the gate structure 160 or the gate electrode 163, and another (e.g., opposite) side or end at a position adjacent to an end of the insulating pattern 171' and/or the drain 140. The contact plug 175' may have a substantially planar uppermost surface.

Compared to the device 1 in FIG. 2, the device 1' in FIG. 3 does not require a polysilicon film deposition and etching process for forming the gate field plate 173, and thus has an advantageous and more convenient manufacturing process.

FIGS. 4 to 12 are cross-sectional views for reference of a method for manufacturing a semiconductor device according to one or more embodiments of the present disclosure.

Hereinafter, a method for manufacturing a semiconductor device according to one or more embodiments of the present disclosure will be described in detail with reference to the accompanying drawings. It should be noted that the manufacturing order of each component may be different in time from that described, and/or certain components may be formed substantially simultaneously.

Figure 4:
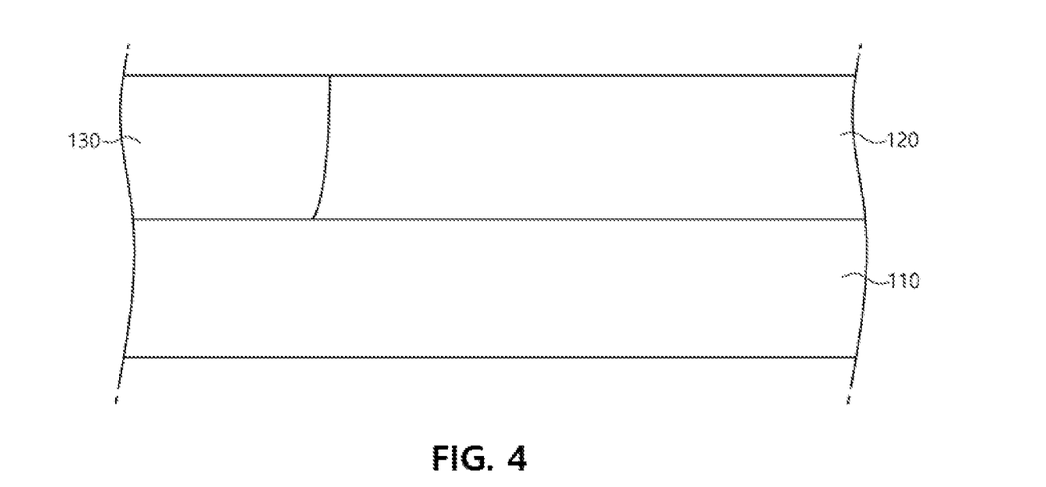
FIGS. 4 to 12 are cross-sectional views for reference of a method for manufacturing a semiconductor device according to one or more embodiments of the present disclosure.

Referring to FIG. 4, first, in an active region, the drift region 120 and the body region 130 may be formed on and/or in the semiconductor layer 110. In one example, the drift region 120 may be formed on the semiconductor layer 110 (e.g., by epitaxial growth) or in the semiconductor layer 110, and the body region 130 may be formed in the drift region 120. For example, the drift region 120 and the body region 130 may have opposite conductivity types (e.g., the drift region 120 may have the second conductivity type, and the body region 130 may have the first conductivity type), and they may be formed by ion implantation processes, although there is no particular limitation on the formation order thereof other than as disclosed herein. Furthermore, the semiconductor layer 110 may have the first conductivity type, and the body region 130 may have a dopant level or concentration greater than that of the semiconductor layer 110.

Figure 5:
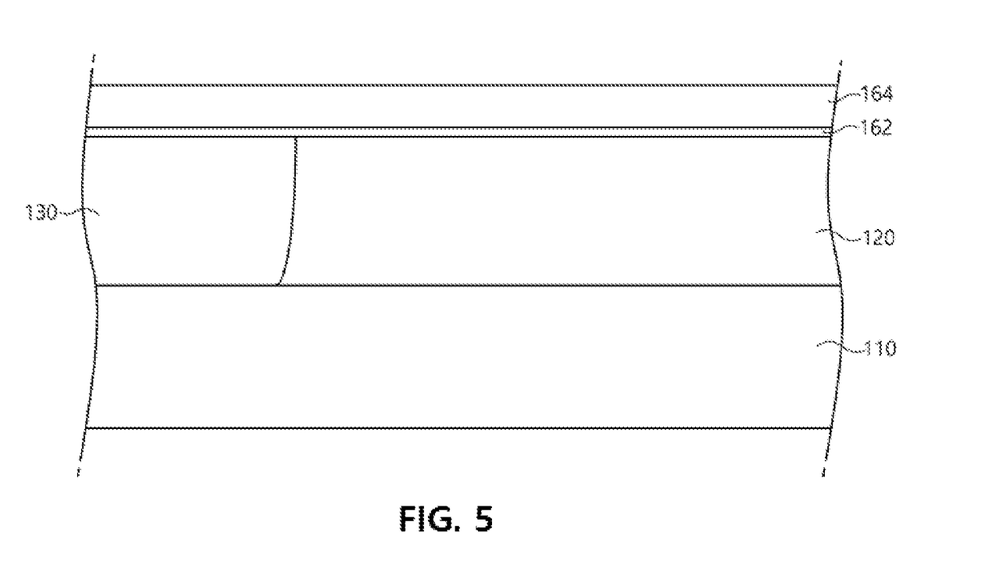
Figure 6:
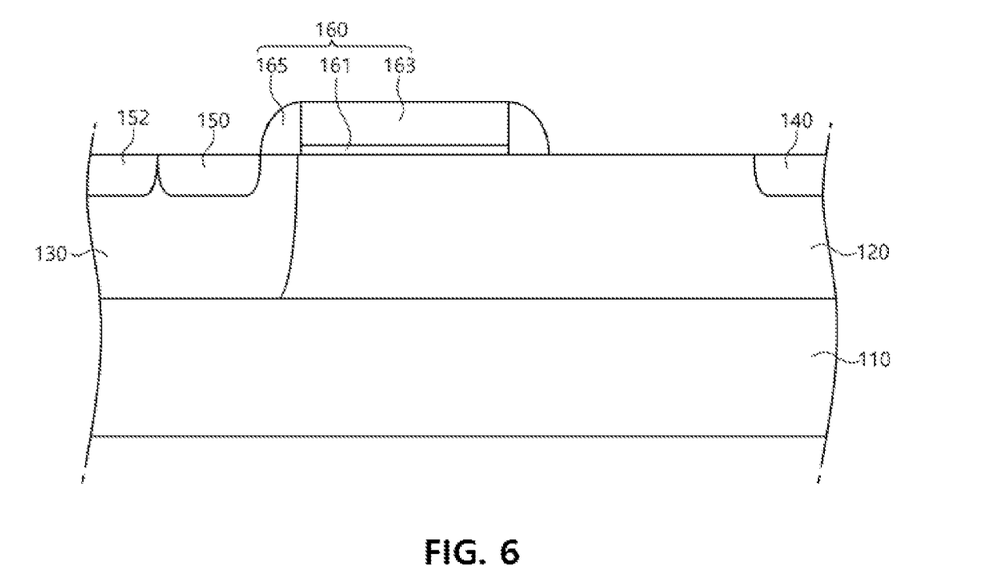

Then, referring to FIGS. 5 and 6, the gate structure 160 is formed on the semiconductor layer 110. For example, after an insulating film layer 162 is formed on the semiconductor layer 110, a polysilicon layer 164 is formed on the insulating layer 162, and then the poly silicon layer 164 and the insulating layer 162 may be sequentially etched using a mask pattern (not shown) to form the gate insulating layer 161 and the gate electrode 163. Thereafter, the sidewall spacer 165 is formed on the side surface of the gate electrode 163. The sidewall spacer 165 may be formed by, for example, depositing one or more insulating layers (not shown) by chemical vapor deposition (CVD) and etching (e.g., anisotropic dry etching).

Then, referring to FIG. 6, the drain 140, the source 150, and the body contact 152 are formed, for example by successive ion implantation processes using different mask patterns exposing the corresponding regions of the drift region 120 or the body region 130.

Figure 7:
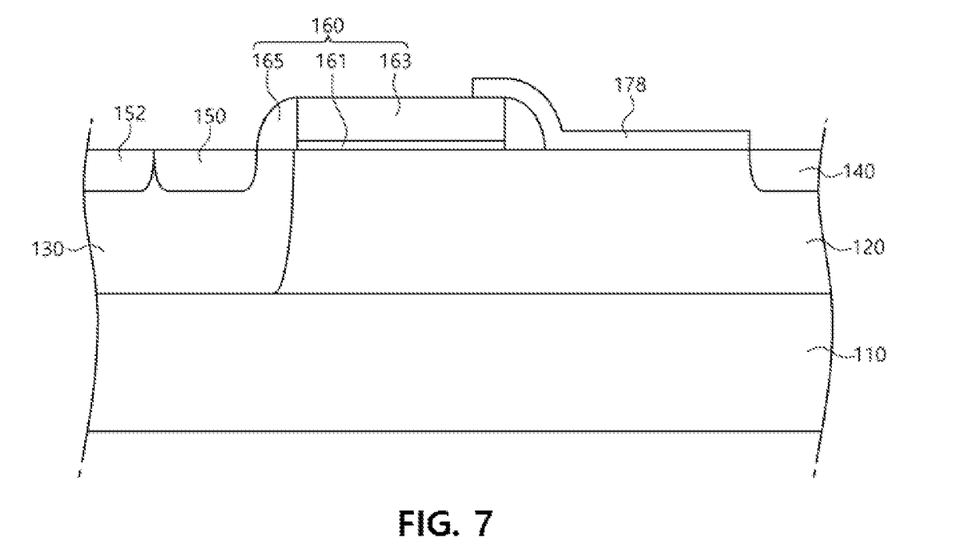

Then, referring to FIG. 7, a sacrificial layer 178, which may comprise, for example, an oxide layer (e.g., undoped silicon dioxide), is formed on the gate structure 160 and the drift region 120 (e.g., by blanket deposition), and after forming a mask pattern (not shown) on the sacrificial layer 178, the sacrificial layer 178 is etched to form the structure shown in FIG. 7.

Figure 8:
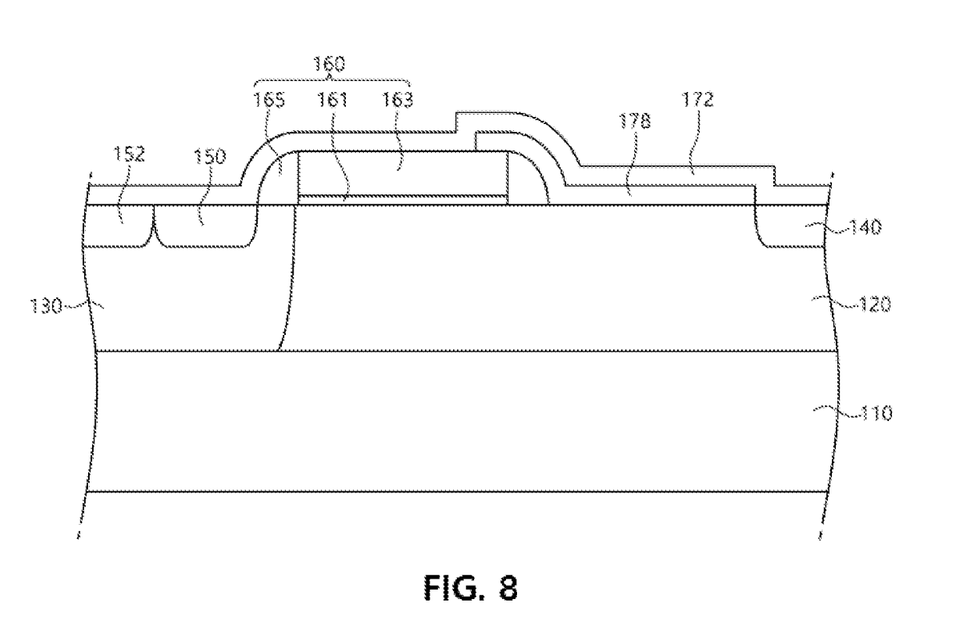
Figure 9:
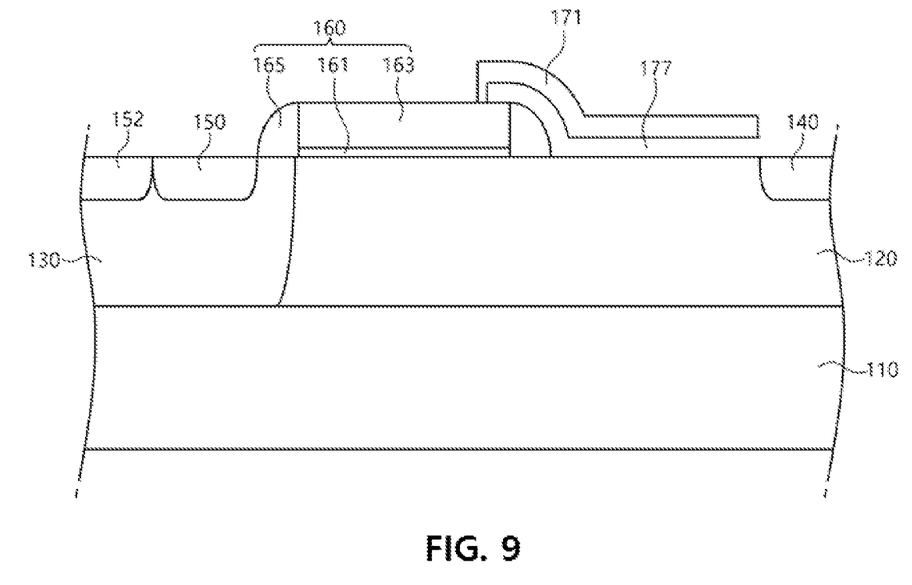

Then, referring to FIGS. 8 and 9, for example, a nitride layer 172 is formed on the sacrificial layer 178 (e.g., by blanket deposition). Thereafter, a mask pattern (not shown) is formed on the nitride layer 172, and the nitride layer 172 is etched. Accordingly, the insulating pattern 171 (see, e.g., FIG. 9) may be formed. Additionally, one side or end of the sacrificial layer 178 may be exposed. Alternatively, after depositing both the sacrificial layer 178 and the nitride layer 172, the nitride layer 172 and the sacrificial layer 178 may be etched substantially simultaneously (e.g., in the same processing sequence, without removing the wafer[s] from the etching apparatus), and there is no limitation thereto except as otherwise disclosed herein.

Then, referring to FIG. 9, the sacrificial layer 178 is etched to form an air gap 177, which is done by, for example, a surface micromachining process. More specifically, for example, a wet etching process is performed to selectively remove the sacrificial layer 178. The material forming the sacrificial layer 178 has an etching selectivity with respect to the material of the insulating pattern 171 so that only the sacrificial layer 178 is etched, without etching the insulating pattern 171. However, it should be noted that in the present disclosure, the formation of the air gap 177 is not limited by the above-described method.

Figure 10:
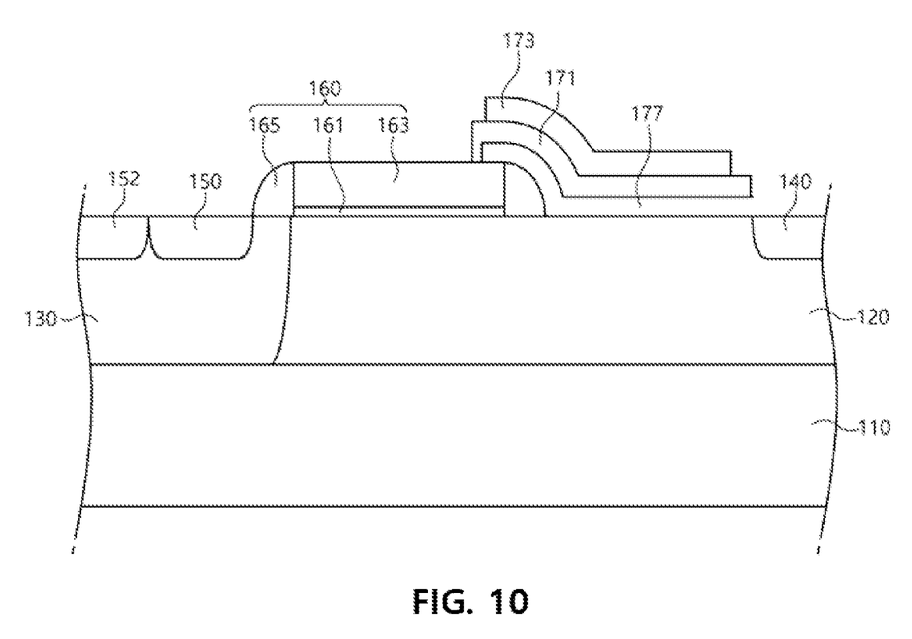

Then, referring to FIG. 10, a gate field plate 173 is formed. For example, a polysilicon film (not shown) is deposited to cover the insulating pattern 171, and the gate field plate 173 may be formed by etching the polysilicon film using a mask pattern (not shown). As described above, the gate field plate 173 may not be present in the semiconductor device 1' (see, e.g., FIG. 3). Alternatively, the sacrificial layer 178 may be selectively removed after formation of the gate field plate 173.

Figure 11:
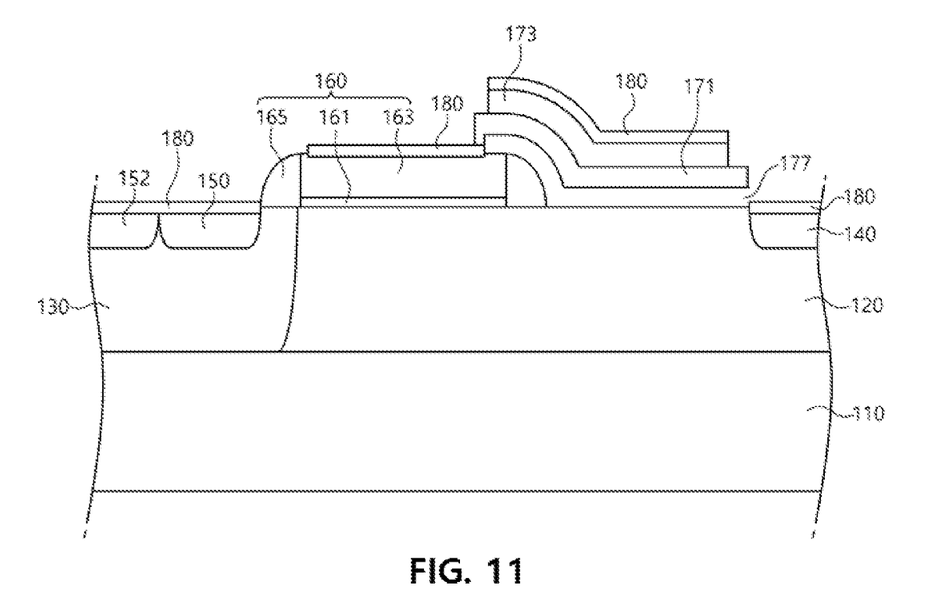

In addition, referring to FIG. 11, a self-aligned silicide (salicide) process may be performed for forming a silicide film 180 on the drain 140, the source 150, the body contact 152, the gate electrode 163 and/or the gate field plate 173 using a metal layer such as cobalt (Co), nickel (Ni), tungsten (W) or titanium (Ti) in order to improve contact resistance and thermal stability.

Figure 12:
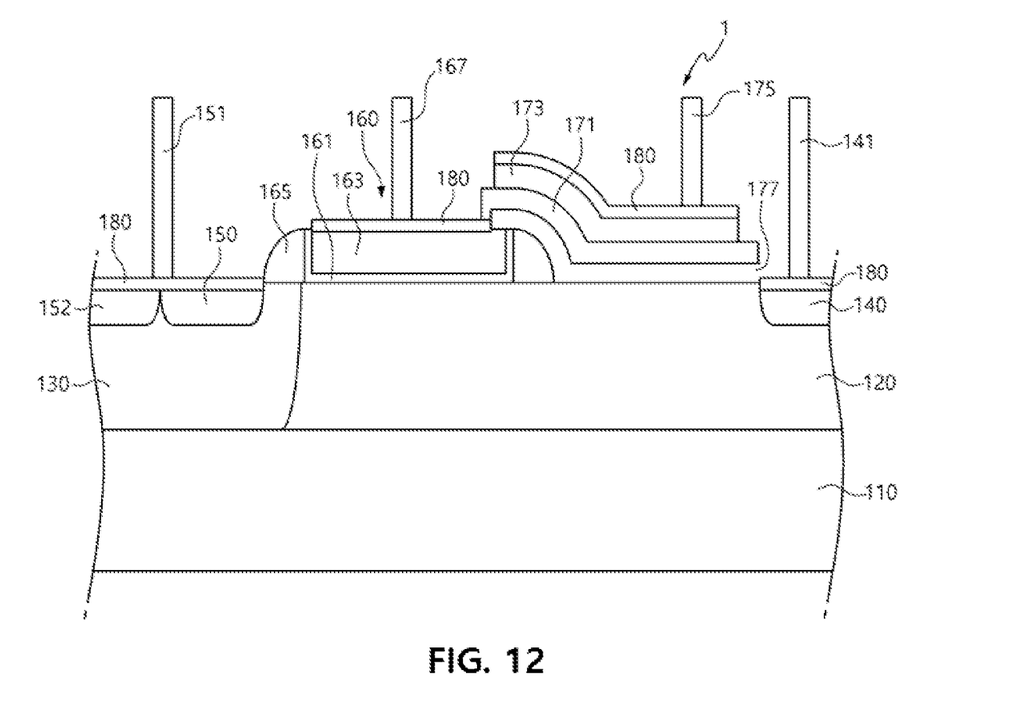

Thereafter, referring to FIG. 12, a drain contact plug 141, a source contact plug 151, a gate contact plug 167, and a plate contact plug 175 are formed. For example, the plugs 141, 151, 167, and 175 may be formed by first forming an insulating layer (not shown) on the structure shown in FIG. 11, forming a plurality of contact holes in the insulating layer, filling the contact holes with a metal material (e.g., one or more conductive materials, such as tungsten or copper), and performing a chemical-mechanical polishing (CMP) process. Here, it should be noted that the contact plug 175 may be formed as shown in FIG. 12 or the contact plug 175' may be formed as shown in FIG. 3.

The above detailed description is illustrative of the present disclosure. In addition, the above description shows and describes preferred embodiments of the present disclosure, but the present disclosure can be used in various other combinations, modifications, and environments. That is, changes or modifications are possible within the scope of the concept of the disclosure disclosed herein, the scope equivalent to the written disclosure, and/or within the scope of skill or knowledge in the art. The above-described embodiments represent implementations of the technical ideas of the present disclosure, and various changes for specific application fields and uses of the present disclosure are possible. Accordingly, the detailed description of the present disclosure is not intended to limit the present disclosure to the disclosed embodiments.

The invention claimed is:

1. A semiconductor device, comprising:
   a semiconductor layer;
   a drift region on a first side in the semiconductor layer;
   a body region on a second side in the semiconductor layer;
   a drain in the drift region;
   a source in the body region;
   a gate structure on the semiconductor layer;
   an insulating pattern on the gate structure and the drift region, and partially covering an upper surface of the gate structure;
   a gate field plate on the insulating pattern and partially overlapping the gate structure; and
   an air gap between a bottom of the insulating pattern and the semiconductor layer.

2. The semiconductor device of claim 1, wherein the insulating pattern extends onto the gate structure from the drift region, and the air gap has a first end or side adjacent to the drain that is open and a second end or side that is covered by the insulating pattern.

3. The semiconductor device of claim 1, further comprising:
   a silicide film on the drain, the source, a gate electrode and the gate field plate.

4. The semiconductor device of claim 1, further comprising:
   contact plugs electrically connected to the drain, the source, a gate electrode, and the gate field plate, respectively; and
   a body contact in contact with the source.

5. The semiconductor device of claim 1, wherein the air gap is formed by a surface micromachining process.

* * * * *